US008196297B2

United States Patent
Whites et al.

(10) Patent No.: US 8,196,297 B2
(45) Date of Patent: Jun. 12, 2012

(54) METHOD OF RAPID PROTOTYPING A MICROWAVE DEVICE

(75) Inventors: Keith W. Whites, Rapid City, SD (US); Anthony K Amert, Rapid City, SD (US); Brian B Glover, Los Alamos, NM (US)

(73) Assignee: South Dakota School of Mines and Technology, Rapid City, SD (US)

( * ) Notice: Subject to any disclaimer, the term of this patent is extended or adjusted under 35 U.S.C. 154(b) by 504 days.

(21) Appl. No.: 12/332,075

(22) Filed: Dec. 10, 2008

(65) Prior Publication Data

US 2010/0139087 A1 Jun. 10, 2010

(51) Int. Cl.
*H05K 3/02* (2006.01)
*H05K 3/10* (2006.01)
(52) U.S. Cl. ............... 29/846; 29/830; 29/874; 29/876
(58) Field of Classification Search ............ 29/846, 29/729, 830, 842, 854, 874, 876; 257/295–297, 257/310; 427/58, 554, 561, 568, 596, 597; 439/151, 218, 507
See application file for complete search history.

(56) References Cited

U.S. PATENT DOCUMENTS

| | | | |
|---|---|---|---|
| 6,454,585 B1 * | 9/2002 | Homer et al. | 439/218 |
| 6,943,398 B2 * | 9/2005 | Ito et al. | 257/310 |
| 2004/0197493 A1 | 10/2004 | Renn et al. | |

OTHER PUBLICATIONS

TMS2006 Annual Meeting & Exhibition for "*2006 Nanomaterials: Materials and Processing for Functional Applications: Nanoscale Electronics*", (Mar. 2006), at Henry B. Gonzalez Convention Center.
Michael Carter, et al., "Characterization of Soft Magnetic Nanomaterial Deposited with $M^3D$ Technology", J Mater Sci (2007) 42:1828-32.
Keith W. Whites, et al., "*Microwave Frequency Antennas Printed on Flexible Substrates*", Proceedings of the Antenna Measurement Techniques Assoc (AMTA) Symposium, Austin Texas (Oct. 2006) 88-93.

* cited by examiner

*Primary Examiner* — Thiem Phan
(74) *Attorney, Agent, or Firm* — Gordon & Rees LLP

(57) ABSTRACT

A method of rapid prototyping of a microwave device, by: providing a plurality of thin sheets of low loss dielectric film, each sheet having a different metallization pattern formed thereon; providing a base onto which each of the plurality of thin sheets of low loss dielectric film can be received, wherein the base comprises a metallization pattern formed thereon such that the placement of each of the plurality of thin sheets thereon forms a different circuit; and sequentially placing each of the plurality of thin sheets of low loss dielectric film onto the base, thereby sequentially forming different circuits across the thin sheet and the base.

9 Claims, 1 Drawing Sheet

METHOD OF RAPID PROTOTYPING A MICROWAVE DEVICE

TECHNICAL FIELD

The present invention relates to the fabrication and testing of miniature microwave devices and systems.

BACKGROUND OF THE INVENTION

As electronic components become increasingly miniaturized, it becomes more difficult to build and model them. This is especially true with respect to manufacturing and simulating miniature microwave devices for several reasons.

First, computer simulations of microwave devices alone are typically not adequate. Instead, actual prototypes must be built to make sure the device functions as intended. This is because such microwave systems generally contain several devices of equivalent complexity and the inherent limitations of simulation software. This dramatically increases total prototyping time to several weeks or months. Second, at microwave frequencies, the difficulties of soldering components to microstrip traces can create an uncertainty at the direct electrical connection that is difficult to characterize and model. Third, when various electronic components are positioned close together on a board, parasitic inductances and capacities and time delays with signal propagation occur. All of this creates circuit design problems when the circuit elements are positioned tightly together in a small area (because the physical circuit elements can interfere with microwave radiation and with each other). Fourth, with microwave devices, the sizes of the electronic components are often within an order of magnitude of the size of the signal wavelength. As such, microwave signals may have a wavelength that is roughly the same length as the size of the physical circuit elements themselves. All of these effects make circuit modeling difficult.

Traditional microwave circuits are produced using printed circuit board technology as is shown in FIG. 1. Such circuits are typically composed of a circuit board 10 (being a low loss dielectric material), and a patterned layer of metal 12 on top (having a very high electrical conductivity). The patterning of metal layer 12 largely determines the response and quality of the microwave device. In FIG. 1, the gap 15 between two pieces of metal is the "critical gap spacing." For the device of FIG. 1 (a band-pass filter), the critical gap spacing 15 determines how well the filter passes energy between "signal input" at end 14 and "filtered signal output" at end 16.

The exemplary device seen in FIG. 1 (and many similar devices like it) are actually quite complex to manufacture and typically require many design iterations before acceptable performance levels are achieved because of the challenges listed above. Even the best available simulation technologies are not able to entirely predict how the design will respond. Therefore, to reach acceptable levels of performance, several values for critical gap 15 are typically chosen and a number of prototypes are sequentially manufactured and tested until the desired performance is reached. This process could easily take several days or weeks, and is extremely costly. Thus, even with powerful design software, the engineering of microwave circuits usually require cut-and-try engineering using old fashioned knives, copper tape and an iterative procedure.

SUMMARY OF THE INVENTION

The present invention provides a method of rapid prototyping of a microwave device, comprising: providing a plurality of thin sheets of a low loss dielectric material (which may optionally comprise a plastic film in various preferred embodiments), each sheet having a different metallization pattern formed thereon; providing a base onto which each of the plurality of thin sheets of low loss dielectric film can be received, wherein the base comprises a metallization pattern formed thereon such that the placement of each one the plurality of thin sheets thereon forms a different circuit; and sequentially placing each of the plurality of thin sheets of low loss dielectric film onto the base, thereby sequentially forming different circuits across the thin sheet and the base.

The present invention also provides a system of rapid prototyping, comprising: a plurality of thin sheets of low loss dielectric film, each sheet having a different metallization pattern formed thereon; and a base onto which each of the plurality of thin sheets of low loss dielectric film can be received, wherein the base comprises a metallization pattern formed thereon, and wherein placement of each of the plurality of thin sheets of low loss dielectric film onto the base results in a different circuit being formed across the thin sheet and the base.

An advantage of the present system is that it can reduce prototyping time of microwave frequency electromagnetic devices from weeks to days or hours. This is accomplished by eliminating the need to produce many different prototype printed circuit boards.

In one aspect of the invention, circuit designers simply leave a strategic gap in their microwave circuit with appropriate dimensions for a subsystem like a filter/antenna/etc. As shown in FIG. 2A, the designer would then open up a "kit" containing different metallization patterns on separate thin sheets of plastic film designed to be the particular microwave frequency device of interest. The kit preferably contains many circuit variations, with each variation printed on a separate sheet of low loss dielectric (e.g.: plastic) film. (In FIG. 2A, only one sheet is shown for ease of illustration).

Next, as seen in FIG. 2B, the circuit designer then sequentially adheres and tests the performance of each microwave frequency device until the desired performance goal is met. I.E: the circuit designer places the first sheet of low loss dielectric film onto the base and then tests the circuit. Next, the circuit designer removes the first sheet of low loss dielectric film, and places the second sheet of low loss dielectric film in its place, and then tests the circuit. This process can be repeated any number of times (with different thin film low loss dielectric inserts), as desired.

Advantageously this process of circuit fabrication would only take a few hours compared to a time frame of multiple days or weeks using a traditional circuit board approach to microwave frequency device prototyping.

DETAILED DESCRIPTION OF THE DRAWINGS

The present invention provides a method of rapid prototyping of a microwave device, by: providing a plurality of thin sheets of low loss dielectric film, each sheet having a different metallization pattern formed thereon; providing a base onto which each of the plurality of thin sheets of low loss dielectric film can be received, wherein the base comprises a metallization pattern formed thereon such that the placement of each one the plurality of thin sheets thereon forms a different circuit; and sequentially placing each of the plurality of thin sheets of low loss dielectric film onto the base, thereby sequentially forming different circuits across the thin sheet and the base.

Figure 1:
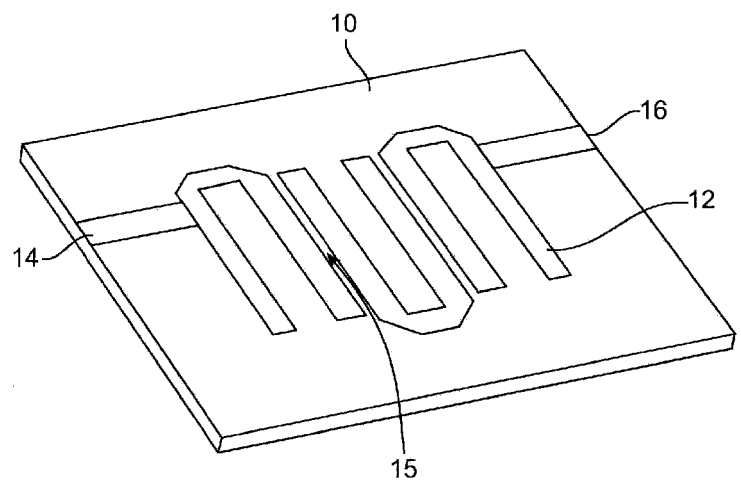
FIG. 1 is an illustration of a prior art system.
Figures 2A, 2B:
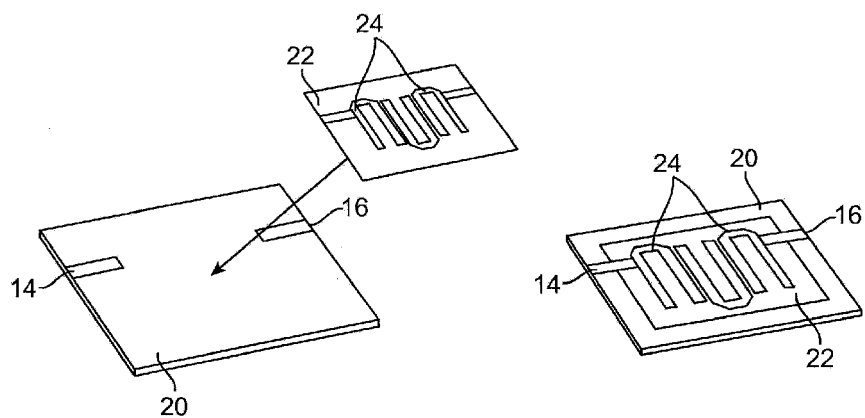
FIG. 2A is an illustration of the present invention prior to assembly.
FIG. 2B is an illustration of the present invention after assembly.

This is seen moving from FIG. 2A to 2B where the first thin sheet of low loss dielectric film 22 is placed onto base 20. The thin sheet of low loss dielectric film 22 can be removed, and replaced with another thin sheet of low loss dielectric film. This process can be repeated again and again. FIG. 2A shows only one thin sheet of low loss dielectric film having a metallization pattern (i.e.: circuit) 24 printed thereon. In accordance with the present invention, a series of thin film low loss dielectric sheets 22 (each having different metallization patterns/circuits thereon) are provided together as a "kit".

In various aspects, the metalization pattern on each of thin sheets 24 of low loss dielectric film may be printed by a direct-write method, including, but not limited to: Maskless Mesoscale Material Deposition ($M^3D$), nScrypt®, and inkjet printing. "$M^3D$®" is a flow guided direct-write process. nScrypt® is a contact process in which a slurry of material is extruded through a small orifice in the printing tip. Alternatively, the metalization pattern on each of the thin sheets of low loss dielectric film may be printed by vapor deposition and subsequent etching. It is to be understood that these approaches are merely exemplary and that the present invention is not limited to any particular system or method of circuit production.

In accordance with the present invention, a first sheet 22 is placed onto base 20, forming a circuit between ends 14 and 16 of base 20. Electrical properties and responses of the circuit can then be measured by the engineer/circuit designer. Next, the first sheet 22 is removed and replaced by another sheet 22, thereby forming a new circuit between ends 14 and 16 of base 20.

In various aspects, at least one of the circuits formed by the present kit and method may be a band-pass filter, coupler, or power divider. It is to be understood, however, that other circuits are also contemplated within the scope of the present invention.

Preferably, the thin sheets of low loss dielectric film 22 are made of a thin material having a low dielectric constant such as polyimide. Optionally, base 20 may be made of a polymer. For example, the circuit platform base material may be a Kapton polymer purchased from DuPont. Such base material provides a flexible, polymer based substrate in a thin film sheet. Moreover, this platform is advantageously able to withstand heats up to 400° C.

In various optional aspects, the metalization pattern uses a highly conductive material comprising silver, copper or gold.

In various optional aspects, the plurality of thin sheets 22 of low loss dielectric film are all manufactured by being stamped out of the same sheet of material. For example, commercial low loss dielectric sheets of polyimide may be purchased and metal circuits may then be patterned onto one side of the sheet of plastic using direct-write technology. After printing, the prototype circuit must be cured using a specific heating profile that is optimized for each combination of inks and printing systems used to achieve the highest possible conductivity.

In one exemplary use of an $M^3D$ direct write system in accordance with the present invention, the sheet of plastic 22 is placed onto a heated stage in an $M^3D$ direct write fabrication machine (not shown). The stage actuates the substrate underneath an aerosol jet that deposits an "ink" to produce the metallization pattern 24. Once the pattern of ink has been deposited onto plastic sheet 22, the plastic sheet 22 may then be removed from the machine and placed in an open air oven for about 1 hour at 350° C. which converts the deposited ink into metal. The completed sheet 22 may then be placed into storage for use in future prototyping.

The present invention also provides a system of rapid prototyping, comprising: a plurality of thin sheets of low loss dielectric film, each sheet having a different metallization pattern formed thereon; and a base onto which each of the plurality of thin sheets of plastic film can be received, wherein the base comprises a metallization pattern formed thereon, and wherein placement of each of the plurality of thin sheets of plastic film onto the base results in a different circuit being formed across the thin sheet and the base.

The circuit itself (i.e. metallization pattern 24) may be formed by the thin sheet being soldered into pads that have been previously milled or otherwise fabricated in base 20 for this purpose. The present invention thus provides a method whereby low loss dielectric sheets 22 can be reliably soldered in this fashion and provide an excellent electrical connection even for microwave-frequency applications without introducing noticeable reflections from impedance mismatch in typical applications such as filters, power splitters, hybrids, etc.

The present system of "plug and play" microwave circuit prototypes can assist microwave device design engineers in rapidly designing and testing new devices. Rather than using time consuming existing techniques of prototyping, design engineers are now able to quickly swap out different "plug and play" circuit prototypes with different circuit elements printed thereon until the microwave device functions as desired. This will greatly reduce the amount of time it takes to make a working prototype and reduce the cost of prototyping.

An advantage of the present invention is that the devices can be pre-printed in kit form and available with small variations, allowing an engineer to quickly remove and replace it with another device that has been slightly modified.

Another advantage is that the electrical circuit devices produced on sheets 22 are thin, flexible, inexpensive, and can be directly soldered into an existing circuit on base 20.

What is claimed is:

1. A method of rapid prototyping of a microwave device, comprising:
   providing a plurality of thin sheets of low loss dielectric film, each sheet having a different metallization pattern formed thereon;
   providing a base, wherein the base comprises a metallization pattern formed thereon such that the placement of each one the plurality of thin sheets directly on top of the base forms a different microwave circuit having a different critical gap spacing, and wherein the metallization pattern formed on the base comprises a gap into which the metallization pattern on each of the thin sheets is received;
   sequentially placing each of the plurality of thin sheets of low loss dielectric film onto the base, thereby sequentially forming different microwave circuits across the thin sheet and the base; and
   testing the performance of each of the different microwave circuits until a desired performance goal is met.

2. The method of claim 1, wherein the metalization pattern on each of the thin sheets of low loss dielectric film is printed by a direct-write method.

3. The method of claim 2, wherein the direct write method is at least one of Maskless Mesoscale Material Deposition, nScrypt, and inkjet printing.

4. The method of claim 1, wherein the metalization pattern on each of the thin sheets of low loss dielectric film is printed by vapor deposition and subsequent etching.

5. The method of claim 1, wherein at least one of the circuits is a band-pass filter, coupler, or power divider.

6. The method of claim 1, wherein the thin sheets of low loss dielectric film are made of a thin material having a low dielectric constant such as polyamide.

7. The method of claim 1, wherein the base is made of a polymer.

8. The method of claim 1, wherein the metalization pattern uses a highly conductive material comprising silver, copper or gold.

9. The method of claim 1, wherein the plurality of thin sheets of low loss dielectric film are all manufactured by being stamped out of the same sheet of material.

\* \* \* \* \*